United States Patent
Knowles et al.

(10) Patent No.: US 10,424,373 B2
(45) Date of Patent: *Sep. 24, 2019

(54) SYSTEM AND METHOD FOR PROVISIONING A REMOTE RESOURCE FOR AN ELECTRONIC DEVICE

(71) Applicant: BLACKBERRY LIMITED, Waterloo (CA)

(72) Inventors: Michael Knowles, Waterloo (CA); Robert Edwards, Waterloo (CA); Andrew Bocking, Los Altos, CA (US); Tatiana Kalougina, Waterloo (CA)

(73) Assignee: BLACKBERRY LIMITED, Waterloo, Ontario ( * ) Notice: Subject to any disclaimer, the term of this patent is extended or adjusted under 35 U.S.C. 154(b) by 0 days.

This patent is subject to a terminal disclaimer.

(21) Appl. No.: 16/119,546

(22) Filed: Aug. 31, 2018

(65) Prior Publication Data

US 2018/0374534 A1 Dec. 27, 2018

Related U.S. Application Data

(63) Continuation of application No. 14/750,625, filed on Jun. 25, 2015, now Pat. No. 10,069,750, which is a (Continued)

(51) Int. Cl.
*G11C 11/00* (2006.01)
*G11C 13/00* (2006.01)
(Continued)

(52) U.S. Cl.
CPC ............ *G11C 13/004* (2013.01); *G11C 11/00* (2013.01); *G11C 13/0002* (2013.01);
(Continued)

(58) Field of Classification Search
CPC ... G11C 11/00; G11C 13/002; G11C 13/0004; G11C 13/0035; G11C 13/0069;
(Continued)

(56) References Cited

U.S. PATENT DOCUMENTS 6,628,934 B2 * 9/2003 Rosenberg ............. G06Q 20/14
455/406
2001/0037460 A1 * 11/2001 Porcari ................... G06F 16/93
726/28
(Continued)

*Primary Examiner* — Henry Tsai
*Assistant Examiner* — Christopher Daley
(74) *Attorney, Agent, or Firm* — Perry + Currier Inc.

(57) ABSTRACT

The invention provides a system and method of provisioning a resource to an electronic device. The method comprises the steps of: (a) maintaining a library of resources at a remote server from the device; (b) after a triggering event, providing a data transmission to the device, the data transmission containing access information for the library that can be extracted by the device and used to access the library; and (c) after a selection event initiated on the device for a specific resource from the library, providing a second data transmission to the device, the second data transmission containing a copy of the specific resource. The system provides a server, a resource, a device and a communication link incorporating the method.

20 Claims, 11 Drawing Sheets

Related U.S. Application Data continuation of application No. 14/096,615, filed on Dec. 4, 2013, now Pat. No. 9,137,328, which is a continuation of application No. 13/477,569, filed on May 22, 2012, now Pat. No. 8,706,840, which is a continuation of application No. 12/550,882, filed on Aug. 31, 2009, now Pat. No. 8,209,454, which is a continuation of application No. 11/394,232, filed on Mar. 31, 2006, now Pat. No. 7,600,064.

(51) Int. Cl.
*G11C 29/50* (2006.01)
*G11C 29/00* (2006.01)
*G11C 11/56* (2006.01)

(52) U.S. Cl.
CPC ...... *G11C 13/0004* (2013.01); *G11C 13/0035* (2013.01); *G11C 13/0069* (2013.01); *G11C 13/0097* (2013.01); *G11C 29/006* (2013.01); *G11C 29/50008* (2013.01); *G11C 11/5678* (2013.01); *G11C 2013/0052* (2013.01); *G11C 2013/0057* (2013.01)

(58) Field of Classification Search
CPC ............ G11C 13/004; G11C 29/50008; G11C 29/006; G11C 11/5678; G11C 2013/0052; G11C 2013/0057
See application file for complete search history.

(56) References Cited

U.S. PATENT DOCUMENTS

2001/0039561 A1* 11/2001 Cho ................... G06Q 10/107
709/200
2006/0101492 A1* 5/2006 Lowcock ............... H04H 60/39
725/58

* cited by examiner

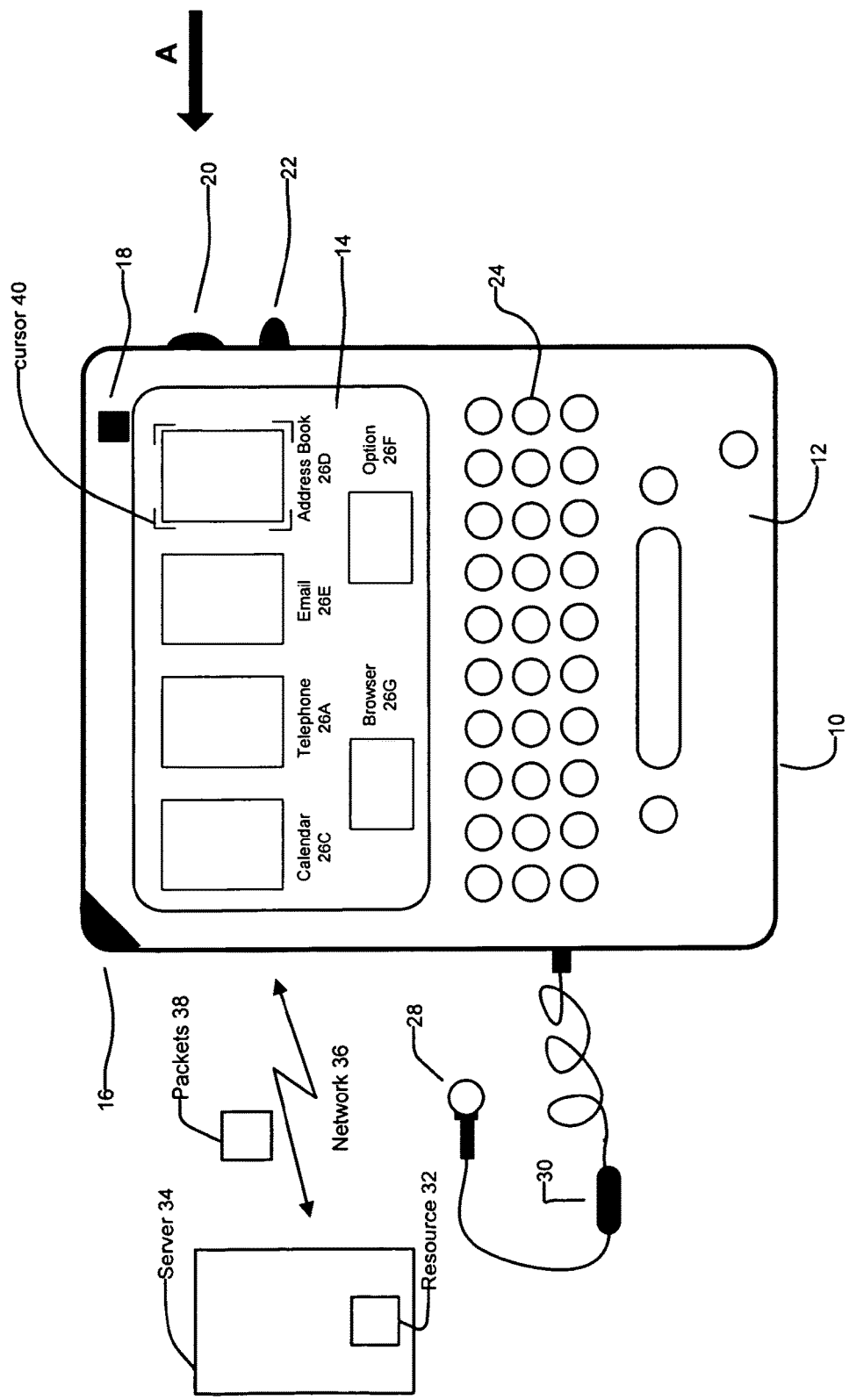

200

| Screen Savers |
| --- |

The following screen images can be downloaded and stored onto your device. If you wish to select image to be used, navigate the cursor to highlight the image, then press the "engage" button to begin downloading it to this device. It will automatically be downloaded to your local library and can be selectively incorporated the display properties for the device.

Image: Automobile     202A

| Auto image |
| --- |

202B

Image: Baseball     204A

| Baseball Image |
| --- |

204B

Image: Cats     206A

| Cats Image |
| --- |

```
                                Ring Tones
The following ring tones can be downloaded and stored onto your device. If you
wish to select image to be used, navigate the cursor to highlight the ring tone
thumbnail, then press the "engage" button to begin downloading it to this device. It
will automatically be downloaded to your local library and can be selectively
incorporated the display properties for the device.

Ring: Fast Ring          210A
    |   Fast Ring image   |
210B

Ring: Slow Ring          212A
    |   Slow Ring Image   |
212B

Ring: Pulse Ring         214A
    |   Pulse Ring Image   |
214B
```

```
┌─────────────────────────────────────────────────────────────────┐
│                         Visual Themes                           │
│ The following background themes can be downloaded and stored onto your device. │
│ If you wish to select a theme, navigate the cursor to highlight the theme thumbnail, │
│ then press the "engage" button to begin downloading it to this device. It will │
│ automatically be downloaded to your local library and can be selectively incorporated │
│ the display properties for the device.                          │
│                                                                 │
│ Theme: Blue      218A                                           │
│   ┌─────────────────────────────────┐                           │
│   │    Palette of Blue backgrounds  │                           │
│   └─────────────────────────────────┘                           │
│ 218B                                                            │
│ Theme: Green     220A                                           │
│   ┌─────────────────────────────────┐                           │
│   │   Palette of Green backgrounds  │                           │
│   └─────────────────────────────────┘                           │
│ 220B                                                            │
│ Theme: Clouds         222A                                      │
│   ┌─────────────────────────────────┐                           │
│   │   Palette of cloud backgrounds  │                           │
│   └─────────────────────────────────┘                           │
│ 222B                                                            │
└─────────────────────────────────────────────────────────────────┘
```

| Email Background Images |
|---|

The following screen images can be downloaded and stored onto your device to provide different backgrounds to your device while you are in different routines in the email program. For example, different backgrounds can be set for viewing received emails from viewing sent emails. If you wish to select image to be used for a particular context, select the context, navigate the cursor to highlight the image, then press the "engage" button to begin downloading it to this device. It will automatically be downloaded to your device and will be used for the selected context.

What context do you want to use the image for: receive/send/saved emails

226

Image: Automobile     228A

| Auto image |

228B

Image: Baseball     230A

| Baseball Image |

230B

Image: Cats     232A

| Cats Image |

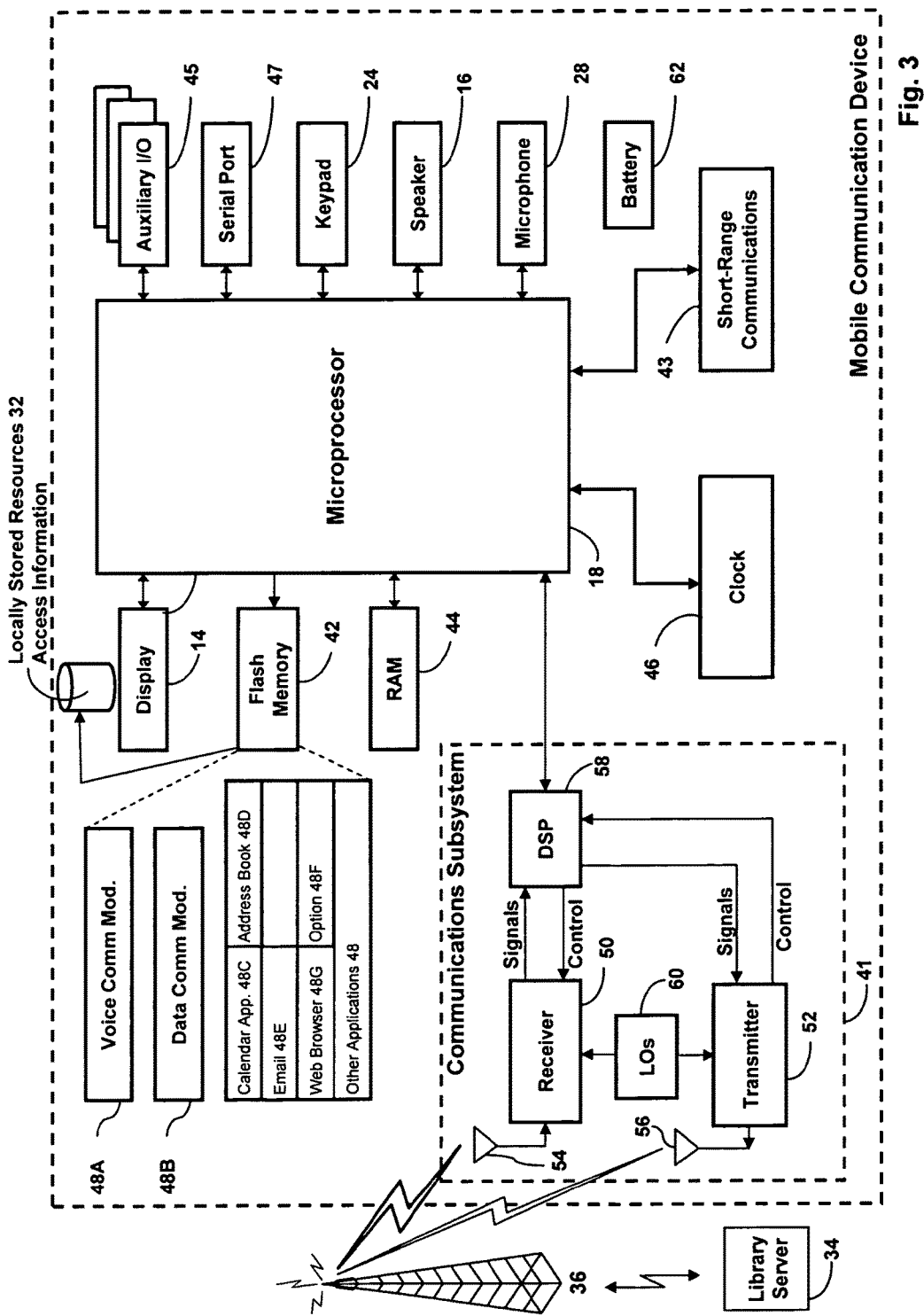

SYSTEM AND METHOD FOR PROVISIONING A REMOTE RESOURCE FOR AN ELECTRONIC DEVICE

FIELD OF THE INVENTION

The invention relates to providing a resource, such as data, information, text or a file, to a communication device. More particularly, the invention relates to a system and method for provisioning remote resources through a central server for the device.

BACKGROUND

Mobile communication devices allow their users to communicate with others in more flexible ways and at more flexible times. Devices have output systems (e.g. displays and speakers) to generate audio and visual signals to the user. Visual information and enunciations generated on displays can notify the user of certain events (e.g. receipt of an email). Similarly, audio enunciators generated through a speaker can notify the user of other events (e.g. an incoming telephone call).

A device has limited capabilities to customize such audio/visual signals. Many devices have limited libraries of data files, screen images and audio clips that can be optionally activated and selectively used by the device. However, retention of such files on the device takes up valuable memory storage. Further such local files present a static set of files that cannot be expanded or changed.

It is desirable to provide an improved system and method for providing such files to one or more electronic devices.

SUMMARY

In a first aspect, a method of provisioning a resource to an electronic device is provided. The method comprises the steps of, (a) maintaining a library of resources at a remote server from the device; (b) after a triggering event, providing a data transmission to the device, the data transmission containing access information for the library that can be extracted by the device and used to access the library; and (c) after a selection event initiated on the device for a specific resource from the library, providing a second data transmission to the device, the second data transmission containing a copy of the specific resource.

In the method after step (c), the access information may be incorporated into a graphical user interface (GUI) associated with an application operating on the device.

In the method, the application may use the access information to provide options for retrieving different resources for different contexts for the application.

In the method, after step (c), the device may store the copy of the specific resource in its internal memory and associates the specific resource with an application operating on the device.

In the method, the specific resource may relate to an audible signal selectively generated by the application operating on the device. Alternatively, the specific resource may relate to an image to be selectively generated by the application. Alternatively still, the specific resource may relate to a theme for backgrounds relating to displays generated by the application.

In the method, a second library of resources may be maintained; the device may have access to the second library and to second access information relating to the second library; and the GUI operating on the device may display the access information and the second access information in an order based on a ranking scheme.

In the method, third access information differing from the access information may be provided where it relates to the library of resources, but is provided to a second device.

In a second aspect, a system for provisioning a resource to an electronic device is provided. The system comprises: a library of resources for the device; a server providing maintenance for the library; a communication link providing the device with access to the library; a data transmission module for extracting access information about the library and selectively providing the access information to the device in a data transmission through the communication link; and a data processing module for receiving the data transmission and updating access information in the device for the resource. In the system, after a triggering event, the data transmission module provides the access information to the device; after a selection event initiated on the device for a specific resource from the library, a second data transmission is provided to the device containing a copy of the specific resource; and the specific resource is incorporated into a graphical user interface (GUI) associated with an application operating on the device.

In the system, the application may use the access information to provide options for retrieving different resources for different contexts for the application.

In the system, the device may store the copy of the specific resource in its internal memory and may associate the resource with the application operating on the device.

In the system the resource may relate to an audible signal selectively generated by the application operating on the device.

In the system, the specific resource may relate to an image to be selectively generated by the application operating on the device. Alternatively, the specific resource may relate to a theme for backgrounds relating to displays generated by the application.

The system may further comprise a second library of resources, wherein the device has access to the second library and is provided with second access information relating to the second library; and the GUI operating on the device displays the access information and the second access information in an order based on a ranking scheme.

In the system, third access information may be provided differing from the access information, but related to the library of resources, where the third information relates to a electronic second device.

Additional features and aspects of the invention are described in the following description of several exemplary embodiments of the invention.

BRIEF DESCRIPTION OF THE DRAWINGS

In the drawings:

FIG. 1 is a schematic diagram of a library system including a remote library server providing access to a library of files to an electronic device as per an embodiment;

FIG. 2A is an exemplary screen image produced on a display of the device of FIG. 1 when an option application operating on the device is accessing a remote library server of the system;

FIG. 2B is another exemplary screen image produced on a display of the device of FIG. 1 when the option application is accessing another remote library server of the system;

FIG. 2C is still another exemplary screen image produced on a display of the device of FIG. 1 when the option application is accessing yet another remote library server of the system;

FIG. 2D is still another exemplary screen image produced on a display of the device of FIG. 1 when an email application is accessing yet another remote library server of the system;

FIG. 3 is a block diagram of internal components of the device of FIG. 1;

DETAILED DESCRIPTION

Figure 4:
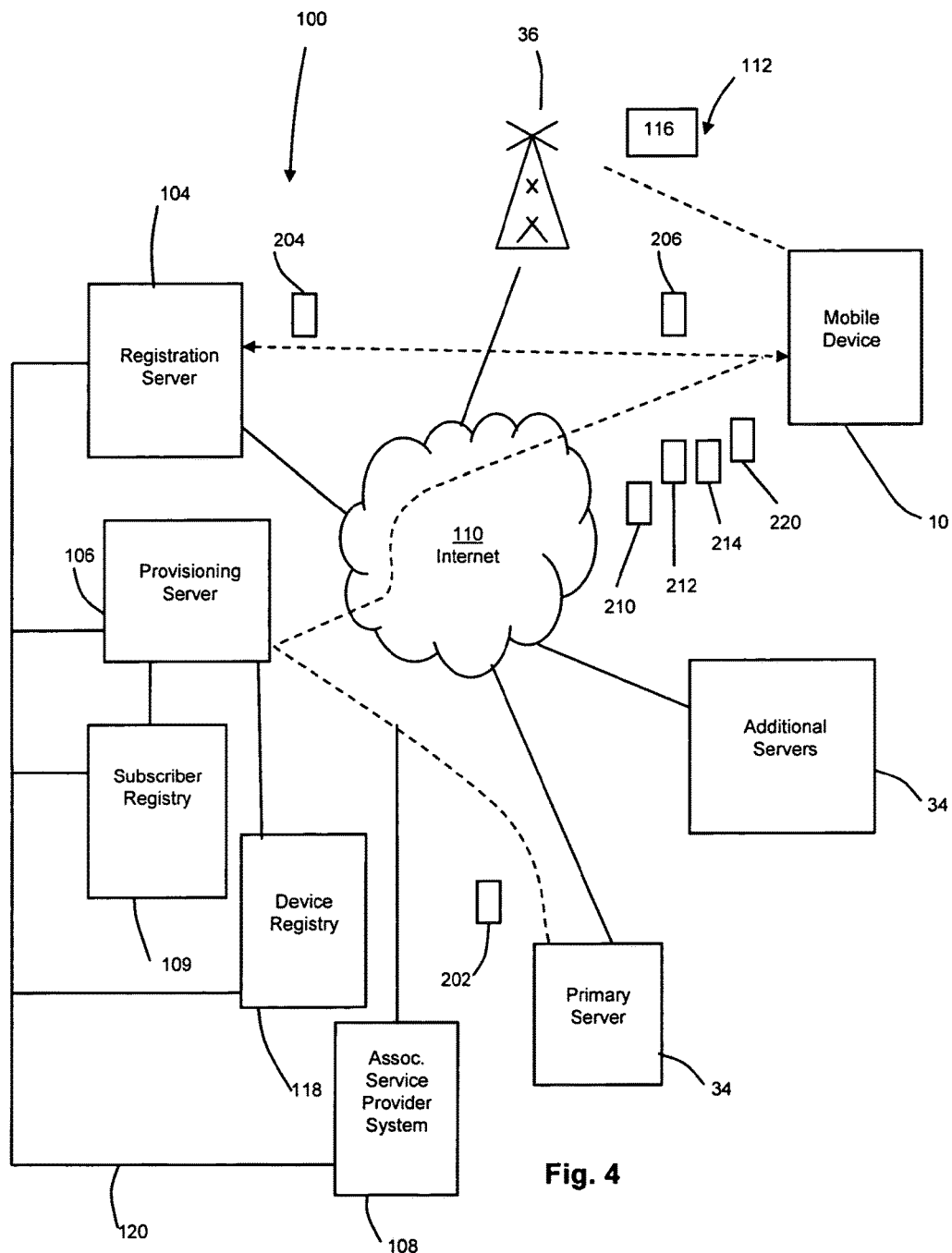
FIG. 4 is a block diagram of the system of FIG. 1.

The present invention provides a system and method for providing a remote library of resources to an electronic device. Typically, although not necessarily, the device is a mobile, wireless communication device. The associated library is dynamically provided to the device from a remote source, such as a server. As such, the library may be dynamically maintained, updated and changed at the remote source, thereby providing the device (and other devices accessing the library) with common set of data and information for that library.

First, a description is provided relating to a device that accesses a library managed by an embodiment. Referring to FIG. 1, an electronic device for receiving electronic communications, in accordance with an embodiment of the invention is indicated generally at 10. In the present embodiment, electronic device 10 is based on a computing platform having functionality of an enhanced personal digital assistant with cellphone, web-browsing and e-mail features. Such functionalities are provided through software and firmware modules operating on device 10. It is, however, to be understood that electronic device 10 can be based on construction, design and functions of other electronic devices, such as smart telephones, desktop computers pagers or laptops having telephony equipment. In a present embodiment, electronic device 10 includes, a housing 12, which frames an LCD display 14, a speaker 16, an LED indicator 18, a trackwheel 20, an exit key 22, keypad 24 and a telephone headset comprised of an ear bud 28 and a microphone 30. Trackwheel 20 and exit key 22 can be inwardly depressed along the path of arrow "A" as a means to provide additional user-input. Keypad 24 is shown as a matrix of three rows of keys with each row having ten keys. In other embodiments a directional key can be provided (not shown), where it is a "rocker"-type key that has a center rest position and can be tilted or moved from its rest position in one of several directions (e.g. up, down, left or right, when viewing the front of device 10) to activate a programmed function associated with the direction of activation. A joystick or a rollerball input device may also be provided instead or in addition to a directional key.

Remote resource 32 is managed and maintained by library server 34. Resource 32 may be a file, data or a combination of other resources. Resource management software operating on server 34 allows resource 32 to be updated and information, including access information, about resource 32 to be extracted and distributed to device 10. The software operating on device 10 provides a GUI interface allowing the user to preview resources 32 and selectively download and store individual resources into device 10. In one embodiment, the GUI is provided as a web page viewed through a web browser on device 10. It will be appreciated that in other embodiments, other access and display techniques can be used to show remote resources on device 10. When a resource is to be downloaded, server 34 extracts a copy of the resource 32 from its database and encapsulates it into one or more data packets 38 and provides the packets to a transmission interface of communication network 36 for conversion and transmission to one or more devices 10. The resource management software allows a user at the server to update and manage the content and associated text and links for resource 32. The software may also control or signal when a data transmission should be created and provided to one or more devices 10. Any trigger may initiate the data transmission, including a change in resource 32, a change in the network or detection of any new devices to the network. It will be appreciated that the devices may be notified of changes or new resources 32 by other communication methods. For example, in another embodiment, the management software may generate and send an email message to device 10 containing a notification of the new content and access link for resource 32. Alternatively, a specific background transmission may be sent to device 10 that is received and processed by device 10 without any interaction by its user. The transmission may include a command to update a text message in a GUI of an application to indicate that new content is available. For example, the command may produce a special "*" flag in the GUI that indicates the presence of the new content. Other commands and messages may be provided. Thereafter, the software can forward data packets 38 to a transmission interface of communication network 36 for conversion and transmission to one or more devices 10. Network 36 may provide a wired connection, a wireless connection or a combination of both between server 34 and device 10. Each server can be identified via individual identification tags. Access information for device 10 required to communicate with each server can be individually controlled by each server 34.

The embodiment allows different servers to provide different resources 32 to device 10. The embodiment provides several library servers 34 including a registration server, a corporate mobile data service (MDS) server, a public MDS server, a generic provisioning server, a wireless application protocol (WAP) server and regular Web servers, content servers or application servers. Each server can manage different resources and as such different image, tone and theme resources. Each server may be positioned at different access points within the communication network(s) for device 10 (e.g. behind firewalls, incorporated with local corporate servers, incorporated with specific carriers for wireless/wired services, incorporated with a generic services for multiple carriers, etc.). As such, different servers can provide different levels of security, access and speed of access when providing resources to devices 10. Each server may also have different protocols for providing their access information to device 10.

Further detail is provided on device 10. Device 10 has components therein to receive such data packets 38 from network 38 and to extract and process data from any received data packets 38. The data extracted from data packets 38 is used by applications operating on device 10.

Various applications are provided on device 10, including email, telephone, calendar, web browsing and address book applications that may use one or more of the remote resources maintained by server 34. As noted earlier, the resources may provide screen images, a set of specific background images and colour palettes for screen schemes and audible ring tone. One or more applications can be used to review, access and download the resources and to incorporate them into the target application.

A graphical user interface (GUI) to activate these applications is provided on display 14 through a series of icons 26. Some of the shown icons include telephone icon 26A, calendar icon 26C, address book icon 26D, email icon 26E, web browser icon 26G and option icon 26F. Such applications can be selected and activated using the keypad 24 and/or the trackwheel 20 to navigate through icons 26 and individually highlight same. Cursor 40 provides a visual cue for each icon as it indicates what icon 26 is currently being "highlighted" as the icons are being navigated.

In the embodiment, one access interface provided for resource 32 on device 10 is through a specific application. As a particular embodiment, option application 48F (FIG. 3) provides a GUI for configuring operational parameters of device 10 (e.g. local time display preferences, font sizes etc.). Option application also provides menu options to access resources 32 for additional (external) libraries for screen savers, ring tones, themes and other resources. When a particular menu option for a library is accessed, a new GUI is generated on device 10 to allow the user to navigate through the contents of the library and select and download an entry. The GUI for accessing resource 32 is preferably provided via a website that is remotely maintained by the server 34 associated with resource 32. Access information to the website is provided to device 10 through a universal resource link (URL) pointing to the web site. The URL is stored in device 10 and is provided to the web browser application on device 10 when the corresponding menu option is activated. As such, server 34 provides access to resource 32 to one or more devices 10 and allows resource 32 to be centrally managed, maintained and distributed.

Additionally or alternatively, resources can be provided through other GUIs: for example, additional background images may be provided through a link in a Pictures application (not shown). More generally, the embodiment allows application-specific provisioning of links to resources for any of the applications on the device.

Further still, the access information for resource 32 may be integrated with specific applications operating on device 10. As such, applications can access resources 32 and their libraries to provide specific, contextual libraries presented to the user in the context of those applications. As such, a resource 32, text relating to the resource and access information for resource 32 can be integrated with the GUI of one or more applications, such that the resource effectively becomes an extension to those applications (as opposed to generic, non-application-specific, downloadable content), thereby providing the ability to extend the look and feel of those applications, dynamically, in the field.

Turning back to some general access mechanisms for a resource 32, when a website for a resource 32 is being navigated through a web browser and the user identifies and selects a particular resource 32 to be downloaded to device 10, the GUI links the particular resource to an access request for the resource. The browser then generates an appropriate access request to download the resource. Other embodiments may provide control handed back to the application for the actual download the resource. In such a configuration, a command would be generated by the application to download the particular resource and the command is sent to server 34.

In any event, once the download command is received by server 34, server 34 prepares a copy of the resource and transmits it to device 10 through communication network 36. Device 10 receives the transmitted copy of the resource and stores it in its local non-volatile memory. Then appropriate links are updated to the applications operating on device 10 to use that resource, as required.

FIGS. 2A-2C provide exemplary images from different websites when different remote libraries are being accessed. In FIG. 2A, an exemplary screen shot 200 generated on display 14 when a user has selected the menu option to review the screen saver library. As shown, the user of device 10 can navigate through a selection of screen images (shown as thumbnail images 202B, 204B and 206B) and selectively download one or more to device 10. Text notes 202A, 204A and 206A provide additional information about the thumbnail images. In FIG. 2B, an exemplary screen shot 208 generated on display 14 when a user has selected the menu option to review the ring tone library. Thumbnail images 210B, 212B and 214B are provided for three different ring tones with accompanying text notes 210A, 212A and 214A. In FIG. 2C, an exemplary screen shot 216 generated on display 14 when a user has selected the menu option to review the themes library. Thumbnail images 218B, 220B and 222B are provided for three theme sets (e.g. colour palettes) with accompanying text notes 218A, 220A and 222A.

FIG. 2D provides an exemplary image from one or more websites when different remote libraries are being accessed during by a specific application. Using email application 48E as an example, different tones and background images from remote resources 32 may be accessed, then retrieved and locally stored in device 10. Specific images or ring tone or other resources may be used to reflect a current state in the application. For example, when viewing incoming emails, the background image may be set to be one image and when viewing saved emails, a different image may be used. Exemplary screen shot 224 generated on display 14 when a user has selected the menu option to review the background image library for the email application. As shown, the user of device 10 first selects a context for a background image through selection 226. Then the user can select one of several screen images (shown as thumbnail images 228B, 230B and 232B) and selectively download one or more to device 10. Text notes 228A, 230A and 232A provide additional information about the thumbnail images. In other embodiments, several types of resources may be shown in the web page (e.g. background images, themes, audio dips), that may be selectively downloaded to provide visual/audible cues for different contexts for the application.

Referring to FIG. 3, details on functional elements of device 10 are provided. The functional elements are generally electronic or electro-mechanical devices. In particular, microprocessor 18 is provided to control and receive almost all data, transmissions, inputs and outputs related to device 10. Microprocessor 18 is shown schematically as coupled to keypad 24, display 14 and other internal devices. Microprocessor 18 controls the operation of the display 14, as well as the overall operation of the device 10, in response to actuation of keys on the keypad 24 by a user. Exemplary microprocessors for microprocessor 18 include Data 950

(trade-mark) series microprocessors and the 6200 series microprocessors, all available from Intel Corporation.

In addition to the microprocessor 18, other internal devices of the device 10 include: a communication subsystem 41; a short-range communication subsystem 43; keypad 24; and display 14; with other input/output devices including a set of auxiliary I/O devices through port 45, a serial port 47, a speaker 16 and a microphone port 32 for microphone 30; as well as memory devices including a flash memory 42 (which provides persistent storage of data) and random access memory (RAM) 44; clock 46 and other device subsystems (not shown). The device 10 is preferably a two-way radio frequency (RF) communication device having voice and data communication capabilities. In addition, device 10 preferably has the capability to communicate with other computer systems via the Internet.

Operating system software executed by microprocessor 18 is preferably stored in a computer readable medium, such as flash memory 42, but may be stored in other types of memory devices, such as read only memory (ROM) or similar storage element. In addition, system software, specific device applications, or parts thereof, may be temporarily loaded into a volatile storage medium, such as RAM 44. Communication signals received by the mobile device may also be stored to RAM 44.

Microprocessor 18, in addition to its operating system functions, enables execution of software applications on device 10. A set of software applications 48 that control basic device operations, such as a voice communication module 48A and a data communication module 48B, may be installed on the device 10 during manufacture or downloaded thereafter.

Communication functions, including data and voice communications, are performed through the communication subsystem 41 and the short-range communication subsystem 43. Collectively, subsystem 41 and subsystem 43 provide the signal-level interface for all communication technologies processed by device 10. Various other applications 48 provide the operational controls to further process and log the communications. Communication subsystem 41 includes receiver 50, transmitter 52 and one or more antennas, illustrated as receive antenna 54 and transmit antenna 56. In addition, communication subsystem 41 also includes processing module, such as digital signal processor (DSP) 58 and local oscillators (LOs) 60. The specific design and implementation of communication subsystem 41 is dependent upon the communication network in which device 10 is intended to operate. For example, communication subsystem 41 of the device 10 may be designed to operate with the Mobitex (trade-mark), DataTAC (trade-mark) or General Packet Radio Service (GPRS) mobile data communication networks and also designed to operate with any of a variety of voice communication networks, such as Advanced Mobile Phone Service (AMPS), Time Division Multiple Access (TDMA), Code Division Multiple Access CDMA. Personal Communication Service (PCS), Global System for Mobile Communication (GSM), etc. Communication subsystem 41 provides device 10 with the capability of communicating with other devices using various communication technologies, including instant messaging (IM) systems, text messaging (TM) systems and short message service (SMS) systems.

In addition to processing communication signals, DSP 58 provides control of receiver 50 and transmitter 52. For example, gains applied to communication signals in receiver 50 and transmitter 52 may be adaptively controlled through automatic gain control algorithms implemented in DSP 58.

In a data communication mode a received signal, such as a text message or web page download, is processed by the communication subsystem 41 and is provided as an input to microprocessor 18. The received signal is then further processed by microprocessor 18 which can then generate an output to the display 14 or to an auxiliary I/O port 45. A user may also compose data items, such as e-mail messages, using keypad 24, a thumbwheel associated with keypad 24, and/or some other auxiliary I/O device connected to port 45, such as a touchpad, a rocker key, a separate thumbwheel or some other input device. The composed data items may then be transmitted over communication network 68 via communication subsystem 41.

In a voice communication mode, overall operation of device 10 is substantially similar to the data communication mode, except that received signals are output to speaker 16, and signals for transmission are generated by microphone 30. Alternative voice or audio I/O subsystems, such as a voice message recording subsystem, may also be implemented on device 10.

Short-range communication subsystem 43 enables communication between device 10 and other proximate systems or devices, which need not necessarily be similar devices. For example, the short-range communication subsystem may include an infrared device and associated circuits and components, or a Bluetooth (trade-mark) communication module to provide for communication with similarly-enabled systems and devices. A WiFi connection may also be provided.

Powering the entire electronics of the mobile handheld communication device is power source 62. Preferably, the power source 62 includes one or more batteries. More preferably, the power source 62 is a single battery pack, especially a rechargeable battery pack. A power switch (not shown) provides an "on/off" switch for device 10. Upon activation of the power switch an application 48 is initiated to turn on device 10. Upon deactivation of the power switch, an application 48 is initiated to turn off device 10. Power to device 10 may also be controlled by other devices and by internal software applications.

Brief descriptions are provided on exemplary applications 48 stored and executed in device 10. Each application may use a locally stored resource (e.g. a screen saver image, ring tone, theme palette) to provide an audio/visual notification for device 10 indicating some event. For example, a resource may be a default background image that is selectively generated on display 14 under certain conditions (e.g. a timeout screen). Additionally, the resource may provide some parameters for preferred display or audio themes generated for applications on device 10. For example, a resource may be a provide colour code information for backgrounds, borders and windows generated on display 14. Generically, the resource provides a parameter that controls how or what is generated as an output on device 10. An application may utilize locally stored resources for a parameter. However, the locally stored resources can be changed to a different resource through resource 32. Device 10 has routines in its applications that will detect when a resource has been downloaded and will correctly associate the resource with the appropriate functions for a related application. These routines may also be provided in part by the option application. Further detail is provided on some applications and their use of resources to control specific parameters of the applications.

As noted, voice communication module 48A enables device 10 to receive and initiate (wireless) telephone calls. Module 48A can be activated by activation of telephone icon 26 on display 14. Module 48A may utilize a locally stored ring tone to generate an audio signal whenever an incoming call is received. The locally stored ring tone can be changed to a different ring tone provided through resource 32. Option application 48F may have routines that will detect when a new ring tone has been downloaded and will correctly associate the downloaded ring tone with the appropriate functions of the application.

Calendar 48C tracks appointments and other status matters relating to the user and device 10. Calendar 48C provides a daily/weekly/month electronic schedule of appointments, meetings and events entered by the user using processor 18 and internal clock 46. The schedule contains data relating to the current accessibility of the user. For example it can indicate when the user is busy, not busy, available or not available. In use, calendar 48C generates input screens on device 10 prompting the user to input scheduled events through keypad 24. Alternatively, notification for scheduled events could be received via an encoded signal in a received communication, such as an e-mail, SMS message or voicemail message. Once the data relating to the event is entered, calendar 48C stores processes information relating to the event; generates data relating to the event; and stores the data in memory in device 10. Customized screens, icons, enunciator tones and text may be provided for calendar 48C for its audio and visual notification routines via resource 32.

Address book 48D enables device 10 to store contact information for persons and organizations. Address book 48D is activated by activation of address book icon 26 on display 14. In particular, name, address, telephone numbers, e-mail addresses, cellphone numbers and other contact information is stored. The data can be entered through keypad 24 and is stored in an accessible a database in non-volatile memory, such as persistent storage 70, which is associated with microprocessor 18, or any other electronic storage provided in device 10. Customized screens, icons and text may be provided for address book 48D via resource 32.

Email application 48E provides modules to allow user of device 10 to generate email messages on device 10 and send them to their addressees. Application 48E also provides a GUI which provides a historical list of emails received, drafted, saved and sent. Text for emails can be entered through keypad 24. Email application 48E is activated by activation of email icon 26 on display 14. Customized screens, icons and text may be provided for email application 48E via resource 32.

Option application 48F is an application that provides a GUI for a user to review and change configuration options and retrieve operating information about device 10. Values for some options can be manually entered by the user through the GUI. Other options may be selected from a library of files. The option application provides access to a GUI to allow the user to browse through resources 32, select one or more resources 32 for downloading and storage into local memory in device 10 and manage integration of the downloaded resources into the effected applications of device 10. It will be appreciated that the effected application may also be the main GUI of device 10.

Browser application 48G is an application that can access information from the Internet (such as HTML or active documents) or an intranet, as well as folders in the local file system and on a network and generate results on display 14. Such applications are known in the art. If a link (as an address) to a web site is provided by another application to browser 48G, it will search the Internet or intranet (as relevant) for the web site associated with the link.

The URLs (or other access information for the resources 32) may be provided to device 10 through several mechanisms. One simple mechanism is manual entry and storage of the access information into device 10 through a user input screens. The screen prompt the user to enter the relevant links and text manually through input dialog boxes. Once the data elements are entered, they are processed and stored in the non-volatile memory. Then the resource (and its related information) can be accessed by device 10 as necessary through the GUI noted above. This mechanism requires the user to have accurate knowledge of the data elements.

A more preferable mechanism is to download the access information into device 10. The access information may be generated at server 34 then provided in a data packet(s) 38 to device 10. An interface software module operating on device 10 receives the data packet(s) 38, then extracts the relevant access information from the packet(s) and stores the access information in non-volatile memory of device 10. For the embodiment, the data packet 38 is provided in a transmitted service record, which is a transmittable data structure containing set field(s) where the access information is encoded therein. As such, expected access information can be extracted from the packet(s) by device 10. Once a service record is received by device 10, it can extract the access information from it and then update its GUIs to selectively identify and initiate access to the web site.

It will be appreciated that service records may contain additional parameters that can be used by device 10. Some parameters may be references to resources 32 that can be associated either with the device or with specific applications on the device. Such parameters may be in the form of content (such as, but not limited to, HTML or WML links) that are compatible with the display capabilities of device 10. However, such parameters may also be data, such as just an URL and descriptive text associated with each external resource 32 (and possibly an identifier to describe which application(s) on the device each particular link applies to). In such cases, the applications operating on device 10 may make those resources available to the user separately (such as via a menu item in an application that will access the content indicated by the resource).

In an alternative embodiment, the resource itself may be provided via a link to a FTP site, where the resource can be downloaded, stored and integrated into the operating parameters for the audio/visual systems on device 10.

It will be seen that a data packet (including a service record) can be generated by server 34 associated with the resource 32, which can then encode and transmit the data packet through its associated communication network to one or more devices 10. Transmission of a service record may be provided based on predetermined conditions. One transmission condition may be the detection of a new device 10 within the transmission capabilities of the communication network 36. For a wireless communication network the transmission capabilities may be set by the transmission range of the network. For a wired communication network, the transmission capabilities may be limited to the devices 10 that are connected to predetermined access points to the network.

Another transmission condition may be to periodically generate and broadcast the service record to all devices 10 that are in transmission capabilities of the communication network. For example, the service record may be sent whenever the server initiates a change to the resource.

Service records for one or more resources 32 may be provided through one or more servers 34. Each library servers can communicate with device 10 to selectively provide a service record to device 10 through its associated communication network 36. To assist in identifying library servers 34, each server 34 can be provided with a unique identification address to identity it to devices 10 and other servers 34. The service record may contain a series of WML and HTML pages that display information for the user and allow the user to provide data using a browser application installed on the device. It will be appreciated that different service records may be provided to different devices from a particular server 34. For example, a particular server can provide different web sites for different devices 10 and the service records would provide specific web sites to different devices 10.

One feature of an embodiment provides a selectable prioritization protocol when two or more resources 32 are provided from one or more servers 34. When two or more service records 38 are received by device 10, the prioritization protocol, if implemented, ranks the access information in service records 38 according to a preset ranking scheme. Following the scheme, the presentation arrangement in the GUI for the received and extracted links from the service records may be presented in an order reflecting the ranking. In some instances where there is a conflict or ranking of resources between two or more service records, only a subset of the service records may be used and presented in the GUI. It will be appreciated that the protocol may be based on several factors including a relative trustworthiness of library server, redundancy of information provided by one resource in view of the availability of another resource from another server, speed of access from a server, etc.

Based on the received service records 38 and any prioritization protocols applied there against, the GUI may be modeled on device 10 to show the resources in a certain order, show some resources as subgroups in a menu, not show selected resources or a combination of any ranking techniques.

As an example of provisioning a resource 32 to device 10, further detail is provided on the processing of a service record 38 received by device 10 from a registration server for a communication network 36. The communication network is a wireless network provided by a given carrier. As such, the carrier is offering wireless services to its customers and may sell, rent or lease devices 10 to its customers. An address is associated with the registration server to identify the registration server in its communication network 36. For devices 10 connecting to the communication network 36, the address of the registration server is stored in the device after it is manufactured. Typically, the address of the registration server will be designated by the provider of the communication network.

Eventually the device 10 is delivered to a user. The user may obtain the device from the wireless network operator or from a reseller who sells the device on behalf of one of the operator. After obtaining the device, the user enables the communication system of the device. The communication system detects the presence of at least one of the networks 36 and uses the stored address of the registration server to send a registration request to the registration server. The registration server, in conjunction with a provisioning server determines whether the device may be provisioned with a service record using the present method. If the service record has been provisioned for the device before, or if the device has been designated not to be provisioned with the associated resource, or if the device has been designated to be provisioned with the associated resource by an alternate method, the registration request is denied. If the registration request is approved, the device is provided with a service record 38 generated by server 34 relating to resource 32 that contains links and text that enable the device 10 to access resource 32. Additional services may also be provisioned in the record.

In another embodiment, resources may be automatically pushed to device 10. For example, a provisioning or registration server may simply push the service record to the device, unsolicited, as soon as it detects that the device is on the network. The device 10 may send a message to the server to confirm receipt of the pushed service record via an appropriate message.

Some further aspects of an embodiment will now be described in greater detail with reference to FIG. 4, which illustrates a system 100 for provisioning an associated resource for a mobile communication device 10.

System 100 includes a registration server, a provisioning server 106, another library server 34, a subscriber registry 109 and a device registry 118. System 100 is typically operated by a service provider A, which may provide the associated resource itself or which may provision the associated resource for device 10 on behalf of another service provider (not shown) that provides the associated resource. In the present exemplary embodiment, resource 32 is provided through a web page provided by library server 34.

System 100 communicates with device 10 across a network 110, such as the Internet or a local area or wide area network (LAN or WAN). Typically, although not necessarily, device 10 is a wireless communication device capable of communicating with network 110 using a wireless communication network 36, which typically will be operated by a network operator 116.

In this exemplary embodiment, device 10 is operated by a user who is a subscriber of services provided by network operator 116.

In an exemplary embodiment, resource 32 is associated with a server 34, which is provided by a service provider B. In the present exemplary embodiment, the network operator 116 is also service provider B, although the network operator 116 may be a distinct entity from service provider B.

Network operator 116/Service provider B maintains a primary service provider system 114 for recording information relating to users that obtain device 10 and/or the resource 34 from service provider B. In embodiments where the network operator 116 and service provider B are distinct entities, each of them may maintain separate systems to record information relating to the user and the specific equipment (such as device 10) and services and resources (such as the primary resource) that each of them provides to the user.

The components of system 100 may communicate with one another through network 110 or through another network 120. Furthermore, one or more components of system 100 may operate on a single computer system or may be integrated into a single server. For example, registration server and provisioning server 106 may be integrated together or they may operate concurrently on a single computer system. In other embodiments of the present invention, registration server or provisioning server 106 or both may consist of multiple processes operating on two or more computers.

Subscriber registry 109 is used by system 100 to track the status of subscribers, who are users of various devices that have subscribed to network access resources offered by network operator 116.

Typically, additional wireless network operators (not shown), like network operator 116, will provide network access services allowing mobile devices to connect to network 110 and to system 100. This is further described below. Each of these network operators may provide devices to subscribers of their services. Subscriber registry 109 is used to track the status of all such subscribers and the record for each subscriber in subscriber registry 109 may include the identity of the specific network operator who provides network access services to the subscriber.

In the present embodiment, subscriber registry 109 has a record for each subscriber that is known to system 100. This may include subscribers of services and resources provided by network operator 116 (and other network operators) who have not yet provisioned the associated resource for use on their mobile devices in addition to subscribers who have provisioned the associated resource for use on their mobile devices. The status of a subscriber in subscriber registry 109 may one or more of the following:

| Status | Meaning |
| --- | --- |
| Associated resource provisioned for subscriber | The subscriber has provisioned the associated resource his or her mobile device. |
| Associated resource cannot or will not be provisioned for subscriber through the method of this invention | The subscriber is not permitted to use the provisioning method of the present invention. It may be possible to provision the resource using a different method. |
| Subscriber known - associated resource not provisioned | The network operator has reported that the subscriber has subscribed to resources from the network operator, but the subscriber has not yet provisioned the resource for use on his or her mobile device. |
| Subscriber Suspended | The subscriber device has been suspended or blocked. This may be done because the subscriber has failed to pay fees to the network operator or for other reasons. |

These status descriptions are only exemplary and additional status categories may be used to describe the status of a subscriber. In addition, the record for each subscriber may contain additional information related to the resources or services that a subscriber has subscribed to.

Device registry 118 is used by system 100 to track the status of mobile communication devices, such as device 10. All devices for which system 100 has provisioned the associated resource have a record in device registry 118. In addition, the device registry 118 may contain records for devices that are capable of having the associated resource provisioned for them. Subscriber registry 118 may also contain records for devices for which the associated resource cannot or will not be provisioned through the method of this invention. The status of a device may be one or more of the following:

| Status | Meaning |
| --- | --- |
| Associated resource provisioned for device | The associated resource has already been provisioned for the device. |
| Associated resource cannot or will not be provisioned through the method of this invention | The device is not permitted to use the provisioning method of the present invention. It may be possible to provision the resource using a different method. |
| Device activated - associated resource not provisioned | The device is known to have been activated, but the associated resource has not been provisioned for it. This status may be used for a device that has been reported as activated by a network operator. |
| Device known but not activated | The device is known to exist (i.e. the identification code of the device has been assigned to it), but the device has not been activated. |
| Suspended | The device has been suspended or blocked. This may be done because the device has been reported lost or stolen. |

These status descriptions are only exemplary and additional status categories may be used to describe the status of a device. In some embodiments of the present invention, some of these status descriptions may not be used. In addition, the record for each device may contain additional information related to the device's capabilities, other services provisioned by service provider A or other service providers, etc. The status of a device in device registry 118 may be set based on advice from network operator 116. For example, the network operator 118 may advise when it has delivered a device to a user, or when a user has reported a device lost or stolen, or when a device should be suspended because the user has failed to pay required fees, etc.

Returning to the present example, the user obtains the primary service from service provider B, and will enter an arrangement with service provider B relating to the primary service.

The user obtains device 10 and subscribes to wireless network access services from network operator 116. The user obtains e-mail service, which is the primary service, from service provider B. As noted above, network operator 116 and service provider B are the same entity, in this exemplary embodiment.

During manufacturing, device 10 is configured to operate with one or more types of communication networks. For example, network 36 may be a GPRS network which provides "always-on" communication capabilities for mobile devices such as device 10. Device 10 will contain a radio antenna and associated circuitry required to detect the presence of the network 36 and to communicate with other components in the network. Device 10 may also be configured to operate with other types of networks, such as other GSM networks or CDMA networks. During or after manufacture, device 10 will typically also be configured with an identification code such as electronic serial number (ESN) or an International Mobile Equipment Identifier (IMEI) that is typically used for wireless communication devices in GSM networks (such as a GPRS network).

In some embodiments, after device 10 has been manufactured, a record may be created for it subscriber registry 118. If a record is created, the status of device will be set to "Device known but not activated". In the present exemplary embodiment, this is not typically done and a record for the device is not created in the device registry until the device is activated.

Figure 5A:
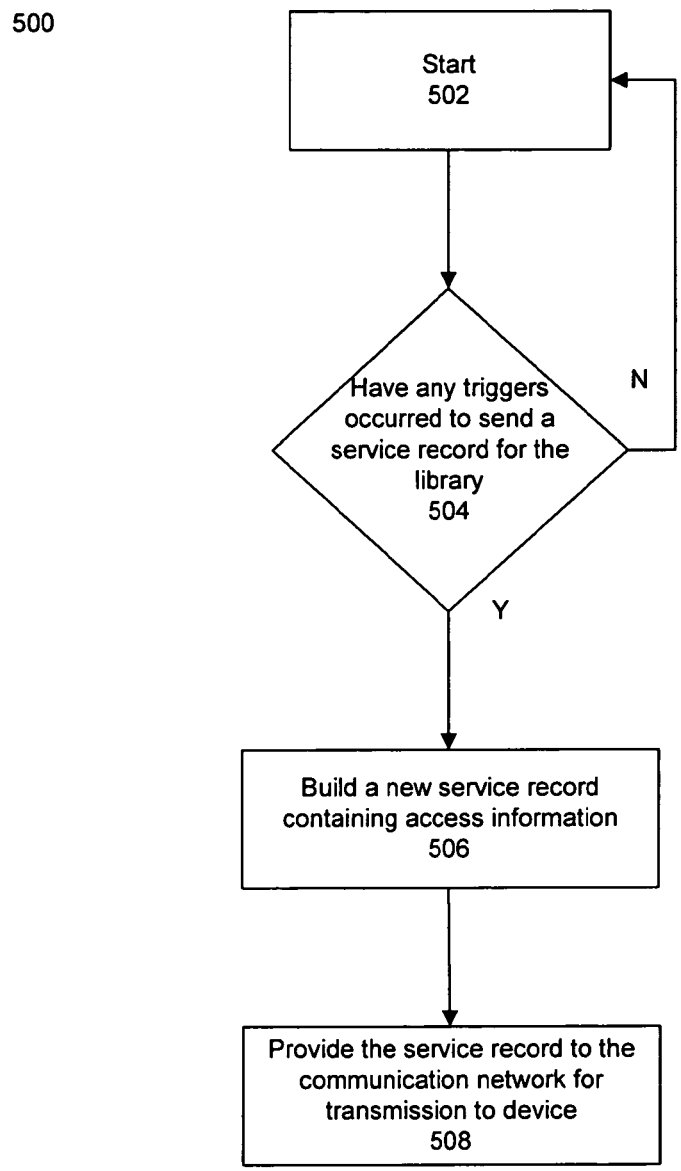
FIG. 5A is a flow chart of exemplary processes and executed by the library server in the system of FIG. 4.

Referring to FIG. 5A, flow chart 500 shows exemplary steps and processes executed by library server 34 in determining how and when to send a new service record relating to its resource 32 to device 10. After the server has been activated at step 502, it monitors its trigger conditions to determine whether a trigger condition has been activated to generate and send a service record at step 504. The condition may be that an access parameter has changed or that a new device has been detected or that a timeout condition has occurred. If no trigger condition has occurred, then the process returns to start at step 502. If a trigger condition has occurred, then the resource is analyzed for any new access information and a service record containing the information is built at step 506. It will be appreciated that the status "Device Not Yet Provisioned" may also be a trigger that is executed upon initial startup of a device. Next the service record is provided to communication network 36 for conversion to a transmission signal and transmission to device 10 at step 508. It will be appreciated that in other system other steps may be provided or the steps may be executed in a different order.

Figure 5B:
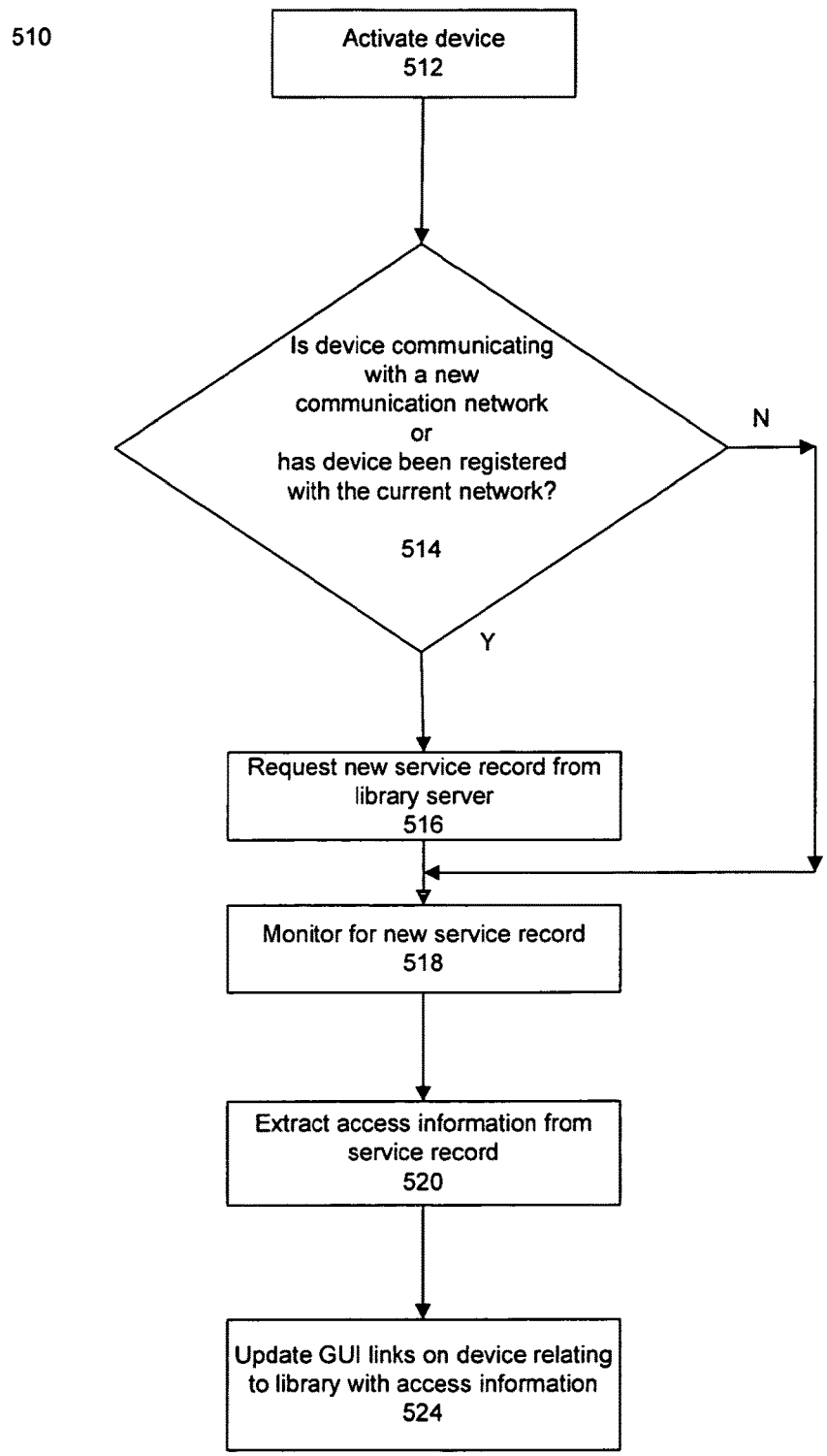
FIG. 5B is a flow chart of exemplary processes executed by the device to monitor for and process access information provided by the library server in the system of FIG. 4.

Referring to FIG. 5B, flow chart 510 shows exemplary steps and processes executed by device 10 in determining when to request a new service record for a resource 32 from server 34 and what to do once a service record is received. After device 10 has been activated at step 512, it checks whether it has roamed to a new carrier service or if it has not been registered with the current carrier service at step 514. If either condition is true, it sends a request for a service record through the carrier at step 516. If neither condition is true, it monitors for the receipt of new service records at step 518. Once a new service record is received (after either step 516 or 518), at step 520, device 10 extracts the access information from the record. At step 522, all data from all received service records from all servers 34 is prioritized. At step 524, the data is ranked and any text data associated with the servers to be populated in the various GUI fields is provided to the GUI. Thereafter, when a user is in option application (or any application associated with the provisioned access information) and activates a menu option to review an external resource, device 10 retrieves the website information associated with the resource and provides it to the browser application 40G. Browser 40G then fetches and manages the web site pages as they am retrieved from server 34. It will be appreciated that in other devices, other steps may be provided or the steps may be executed in a different order.

Figure 5C:
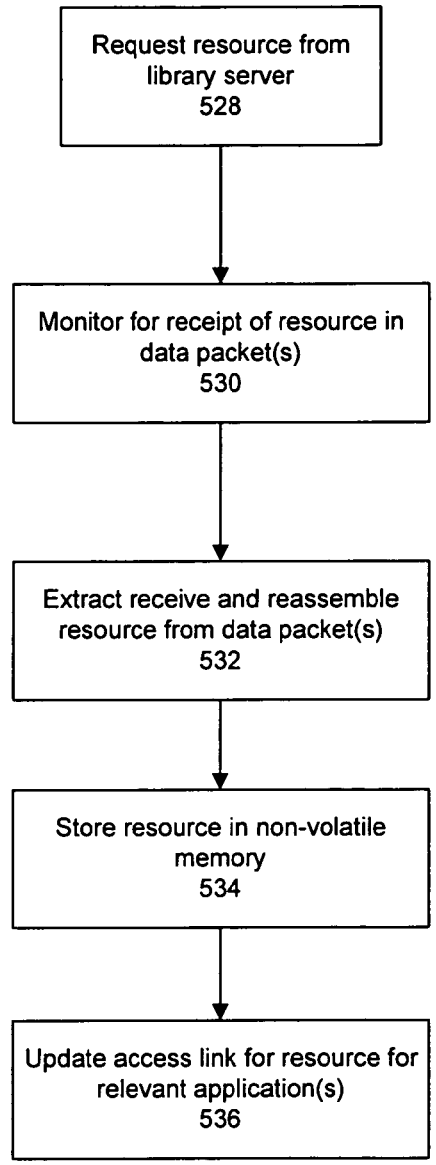
FIG. 5C is a flow chart of exemplary processes executed by the device to monitor for and process a resource downloaded from the library server in the system of FIG. 4.

Referring to FIG. 5C, flow chart 526 shows exemplary steps and processes executed by device 10 when a resource is being selected for downloading. First, at step 528, device 10 creates and sends a request for a particular resource 32 from the target library server 34. Then, at step 530, device 10 monitors for receipt of the resource 32 over communication network 36. In the meantime, server 34 has received the request and has prepared and transmitted a copy of the resource to device 10 over network 36. Next, at step 532, device 10 extracts and reassembles the resource from the received data packet(s). Next at step 534, the reassembled resource is stored in the non-volatile memory of device 10. Finally, at step 536 device 10 updates applications that can access the downloaded resource to use the resource as necessary.

Figure 6:
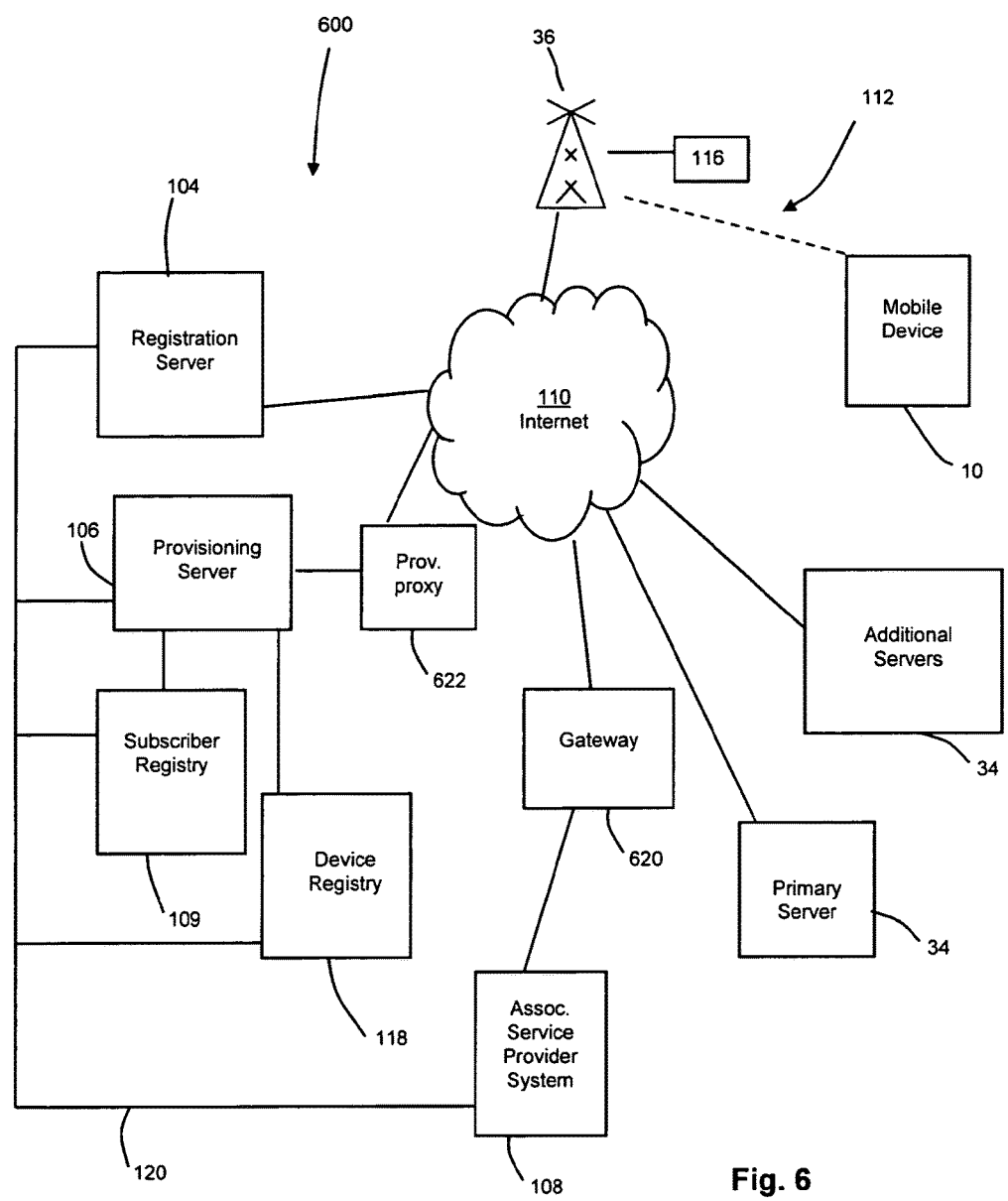
FIG. 6 is a block diagram of another system that may be used to provide a library server to the device of FIG. 1 according to an embodiment.

Reference is next made to FIG. 6, which illustrates another system 600 that may be used by an embodiment. System 600 is similar to system 100 and identical components are given the same reference numeral as in system 100. System 600 includes a gateway 620 and a provisioning proxy 622.

Gateway 620 operates as an interface between device 10 and provisioning server 106 and associated resource. Gateway 620 may be an assembly of one or more computer systems that serve to streamline communications between provisioning server 106 and mobile communication devices such as device 10. Similarly, gateway 620 serves to streamline communications between associated resource provider and mobile communication devices.

Provisioning proxy 622 serves as an interface between gateway 620 and provisioning server 106, similarly serving to streamline communications between gateway 620 and provisioning server 106 by, for example, conducting the operation of pushing service records to device 10. Provisioning proxy 622 may also serve to provide secure communication between device 10 and provisioning server 106.

The present invention has been described here by way of example only. Various modification and variations may be made to these exemplary embodiments without departing from the spirit and scope of the invention, which is limited only by the appended claims.

We claim:

1. A method of provisioning files to an electronic device comprising:

storing (i) selectable configuration options in a memory of the electronic device, corresponding to respective files for use by an application on the electronic device; and (ii) for each selectable configuration option, a set of selectable context options defining respective conditions under which the corresponding file is to be used by the application;

receiving, at the electronic device, a data transmission containing access information identifying a location of a file maintained in a library of files at a server;

extracting, at the electronic device, the access information from the data transmission;

updating the selectable configuration options to provide a selectable option corresponding to the file identified by the access information and a corresponding set of selectable context options;

receiving a selection of the selectable option and of a corresponding selectable context option;

responsive to receiving the selection, sending a request for the file to the server;

receiving, at the electronic device, a second data transmission from the server, the second data transmission containing a copy of the file; and storing the file in association with the application operating on the electronic device.

2. The method as claimed in claim 1, wherein the access information is a Uniform Resource Locator.

3. The method as claimed in claim 1, wherein the file defines an audible signal selectively generated by the application.

4. The method as claimed in claim 1, wherein the file defines a portion of a graphical user interface for the application.

5. The method as claimed in claim 4, wherein the file defines an image to be selectively generated by the application.

6. The method as claimed in claim 5, wherein the image defines a background of the graphical user interface.

7. The method as claimed in claim 1, wherein the data transmission containing access information identifying the location of the file maintained in the library of files at the server is received, after detecting, at the electronic device, that the electronic device has been approved for an initial registration with the communication network.

8. An electronic device comprising:

a microprocessor;

a communication module for receiving data transmissions from a communication network; and a memory device storing:

selectable configuration options corresponding to respective files for use by an application on the electronic device; and (ii) for each selectable configuration option, a set of selectable context options defining respective conditions under which the corresponding file is to be used by the application; and a first module providing instructions for execution by the microprocessor that causes the electronic device to:

receive a data transmission containing access information identifying a location of a file maintained in a library of files at a server;

extract the access information from the data transmission;

update the selectable configuration options to provide a selectable option corresponding to the file identified by the access information and a corresponding set of selectable context options;

receive a selection of the selectable option and of a corresponding selectable context option;

responsive to receiving the selection, send a request for the file to the server;

receive a second data transmission from the server, the second data transmission containing a copy of the file; and store the file in association with the application operating on the electronic device.

9. The electronic device as claimed in claim 8, wherein the access information is a Uniform Resource Locator address.

10. The electronic device claimed in claim 8, wherein the file defines an audible signal selectively generated by the application.

11. The electronic device as claimed in claim 8, wherein the file defines a portion of a graphical user interface for the application.

12. The electronic device claimed in claim 11, wherein file defines an image to be selectively generated by the application.

13. The electronic device claimed in claim 12, wherein the image defines a background of the graphical user interface.

14. The electronic device claimed in claim 8, wherein the data transmission containing access information identifying the location of the file maintained in the library of files at the server is received after detecting that the electronic device has been approved for an initial registration with the communication network.

15. A non-transitory computer-readable medium storing a computer program, wherein execution of the computer program at an electronic device causes the electronic device to:

store (i) selectable configuration options in a memory of the electronic device, corresponding to respective files for use by an application on the electronic device; and (ii) for each selectable configuration option, a set of selectable context options defining respective conditions under which the corresponding file is to be used by the application;

receive a data transmission containing access information identifying a location of a file maintained in a library of files at a server;

extract the access information from the data transmission;

update the selectable configuration options to provide a selectable option corresponding to the file identified by the access information and a corresponding set of selectable context options;

receive a selection of the selectable option and of a corresponding selectable context option;

responsive to receiving the selection, send a request for the file to the server;

receive a second data transmission from the server, the second data transmission containing a copy of the file; and store the file in association with the application operating on the electronic device.

16. The non-transitory computer-readable medium as claimed in claim 15, wherein the file defines an audible signal selectively generated by the application.

17. The non-transitory computer-readable medium as claimed in claim 15, wherein the file defines a portion of a graphical user interface for the application.

18. The non-transitory computer-readable medium as claimed in claim 17, wherein the file defines an image to be selectively generated by the application.

19. The non-transitory computer-readable medium as claimed in claim 18, wherein the image defines a background of the graphical user interface.

20. The non-transitory computer-readable medium as claimed in claim 15, wherein, the data transmission containing access information identifying a location of the file maintained in the library of files at the server is received, after detecting, at the electronic device, that the electronic device has been approved for an initial registration with the communication network.

* * * * *